(12) United States Patent
Jung

(10) Patent No.: US 12,165,790 B2
(45) Date of Patent: Dec. 10, 2024

(54) FILM-TYPE CABLE INCLUDING FUSE LINE

(71) Applicant: LG Energy Solution, Ltd., Seoul (KR)

(72) Inventor: Sang-Eun Jung, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 30 days.

(21) Appl. No.: 18/004,759

(22) PCT Filed: Sep. 2, 2021

(86) PCT No.: PCT/KR2021/011882
§ 371 (c)(1),
(2) Date: Jan. 9, 2023

(87) PCT Pub. No.: WO2022/055179
PCT Pub. Date: Mar. 17, 2022

(65) Prior Publication Data
US 2023/0260675 A1 Aug. 17, 2023

(30) Foreign Application Priority Data

Sep. 8, 2020 (KR) .......................... 10-2020-0114925

(51) Int. Cl.
*H01B 7/08* (2006.01)
*H01B 3/30* (2006.01)
*H01M 50/583* (2021.01)

(52) U.S. Cl.
CPC ............... *H01B 7/08* (2013.01); *H01B 3/306* (2013.01); *H01M 50/583* (2021.01)

(58) Field of Classification Search
CPC .... H01H 85/046; H01H 85/055; H01H 85/08; H01B 7/08
See application file for complete search history.

(56) References Cited

U.S. PATENT DOCUMENTS 5,712,610 A * 1/1998 Takeichi .............. H01H 85/046
337/416
10,593,502 B1 * 3/2020 Lanoe ................ H01H 85/0241
(Continued)

FOREIGN PATENT DOCUMENTS

CN 210378535 U 4/2020
JP H09023048 A 1/1997
(Continued)

OTHER PUBLICATIONS

International Search Report for PCT/KR2021/011882 mailed Jan. 3, 2022. 3 pgs.
(Continued)

*Primary Examiner* — Chau N Nguyen

(74) *Attorney, Agent, or Firm* — Lerner David LLP

(57) ABSTRACT

A film-type cable according to the present disclosure includes an insulating film and a plurality of conducting wires covered by the insulating film and extending in a first direction, each of the plurality of conducting wires separate by a predetermined distance, wherein each of the plurality of conducting wires includes: a fuse pattern section configured to be broken when a current exceeding a rated current flows through the fuse pattern section; and a normal section configured not to be broken when a current exceeding the rated current flows through the normal section, wherein the fuse pattern section may be thinner than the normal section.

8 Claims, 6 Drawing Sheets

(56) References Cited

U.S. PATENT DOCUMENTS

| | | |
|---|---|---|
| 2009/0102013 A1 | 4/2009 | Park |
| 2010/0245026 A1* | 9/2010 | Kobayashi ........... H01H 85/046 337/293 |
| 2012/0205144 A1 | 8/2012 | Ozaki et al. |
| 2015/0303144 A1 | 10/2015 | Iwamoto et al. |
| 2018/0033578 A1* | 2/2018 | Ogawa ................. H01H 69/022 |
| 2019/0172673 A1 | 6/2019 | Yoneda |
| 2019/0189382 A1 | 6/2019 | Holland et al. |
| 2020/0143957 A1 | 5/2020 | Kim et al. |
| 2020/0243814 A1 | 7/2020 | Kang et al. |

FOREIGN PATENT DOCUMENTS

| | | |
|---|---|---|
| JP | 2006318896 A | 11/2006 |
| JP | 200731146 A | 11/2007 |
| JP | 2007311467 A | 11/2007 |
| JP | 2012-018777 A | 1/2012 |
| JP | 2016060089 A | 4/2016 |
| JP | 2017011191 A | 1/2017 |
| JP | 2017204525 A | 11/2017 |
| JP | 6507056 * | 4/2019 |
| KR | 100793725 B1 | 1/2008 |
| KR | 2009-0039200 A | 4/2009 |
| KR | 200453427 Y1 | 5/2011 |
| KR | 20180011747 A | 2/2018 |
| KR | 20190004804 A | 1/2019 |
| KR | 20200051095 A | 5/2020 |
| KR | 20200093334 A | 8/2020 |
| WO | 9962086 A2 | 12/1999 |

OTHER PUBLICATIONS

Extended European Search Report including Written Opinion for Application No. 21867045.3 dated Oct. 18, 2023, pp. 1-8.

\* cited by examiner

PRIOR ART

FILM-TYPE CABLE INCLUDING FUSE LINE

CROSS-REFERENCE TO RELATED APPLICATIONS

The present application is a national phase entry under 35 U.S.C. § 371 of International Application No. PCT/KR2021/011882, filed on Sep. 2, 2021, which claims priority to Korean Patent Application No. 10-2020-0114925 filed on Sep. 8, 2020, in the Republic of Korea, the disclosures of which are incorporated herein by reference.

TECHNICAL FIELD

The present disclosure relates to a film-type cable, and more particularly, to a film-type cable that may be applied for cell voltage sensing to a vehicle battery module and may have an overcurrent blocking function by itself.

BACKGROUND ART

Lithium secondary batteries, which have high energy storage density, can be lightweight and miniaturized, and have advantages such as excellent stability, low discharge rate, and long lifespan, have recently been actively utilized as electric vehicle batteries. For reference, lithium secondary batteries are generally classified into cylinder, square, and pouch types according to their manufacturing types, and their use spans not only electric vehicle batteries, but also EES batteries and other electric devices.

Currently, one lithium secondary battery unit (cell) cannot provide sufficient output to drive an electric vehicle. In order to apply a secondary battery as an energy source for an electric vehicle, battery modules in which a plurality of lithium ion battery cells are connected in series and/or in parallel should be configured, and in general, a battery pack is configured by including a battery management system (BMS) for connecting the battery modules in series and operatively maintaining the battery modules, a cooling system, and a battery disconnection unit (BDU).

Meanwhile, in a battery module of the related art, a harness wire has been used as a component for sensing voltages and temperatures of respective battery cells and transmitting the sensed voltages and temperatures to the BMS, but recently, film-type cables such as flexible flat cables (FFC) or flexible printed circuit boards (FPCB), which are lightweight and highly flexible thereby enabling three-dimensional wiring and transmitting a number of signals, are widely used.

FIG. 1 is a diagram of a portion of FPCB 1 of a battery module of the related art. As shown in FIG. 1, FPCB 1, which is a kind of film-type cables, includes one surface-mount device (SMD) fuse 3 for each sensing line 2 for the purpose of protecting the sensing line 2 and a BMS circuit (not shown) connected thereto from unexpected overcurrent. Here, the SMD fuse 3 refers to a chip-type device that is mountable on the sensing line and is configured in such a manner that an internal conducting wire is broken when a current greater than or equal to a rated current flows.

However, due to a material cost of a SMD fuse and a processing cost incurred by mounting the SMD fuse, the price of film-type cables of the related art increases, and the defect rate generated during the SMD fuse mounting process is not small. Accordingly, there is a need for a method to implement a fuse function without mounting an SMD fuse on sensing line of a film-type cable.

DISCLOSURE

Technical Problem

The present disclosure is designed to solve the problems of the related art, and therefore the present disclosure is directed to providing a film-type cable capable of implementing a fuse function without mounting a separate fuse product.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a film-type cable including an insulating film and a plurality of conducting wires covered by the insulating film and extending at a predetermined interval therebetween, wherein each of the plurality of conducting wires includes: a fuse pattern section provided to be broken when a current exceeding a rated current flows; and a normal section provided not to be broken when a current exceeding the rated current flows, and the fuse pattern section may be thinner than the normal section.

The insulating film includes: a base film arranged below the plurality of conducting wires; and a cover film arranged above the plurality of conducting wires in the normal section, and the plurality of conducting wires are formed of silver nano ink printed on a surface of the base film.

A smoke-proof coating solution coated in an upper portion of the fuse pattern section of the plurality of conducting wires may be further included.

An adhesive layer is provided between the plurality of conducting wires in the normal section and the cover film, and the smoke-proof coating solution may be filled in a concave groove portion formed by the cover film, the adhesive layer, and the fuse pattern section.

The smoke-proof coating solution may include at least one of an urethane resin, an epoxy resin, and an acrylic resin.

The fuse pattern sections of the conducting wires adjacent to each other may be alternatingly arranged.

Each of the plurality of conducting wires may have the same width in the fuse pattern section as in the normal section and a smaller thickness in the fuse pattern section than in the normal section, and have a pattern of a "ㄹ" shape or "S" shape that is repeated and extended.

The conducting wire in the fuse pattern section may include: a thin-film portion having a width identical to a width of the conducting wire in the normal section and extending straight in one direction; and protrusions that are repeatedly formed to protrude upward at a predetermined interval in an extending direction of the thin-film portion.

The insulating film may include a polyimide material.

According to another aspect of the present disclosure, a battery module including the film-type cable may be provided.

Advantageous Effects

In a film-type cable according to the present disclosure, the thickness of a conducting wire in a fuse pattern section is less than the thickness of a conducting wire in a normal section, and thus, when an overcurrent flows, the fuse pattern section may function as a fuse. Accordingly, the film-type cable of the present disclosure does not need to mount a surface-mount device (SMD) fuse, thereby eliminating the burden caused by an increase in price due to a material cost of the SMD fuse, a processing cost incurred by mounting the SMD fuse, and a defect cost.

According to the present disclosure, the thickness of the conducting wire in the normal section and the thickness of the conducting wire in the fuse pattern section may be precisely and differentially implemented by adjusting the amount of ink on a base film by a printed electronic method, thereby ensuring the reliability of a fuse function.

Also, according to the present disclosure, because a smoke-proof coating solution or a coating layer covers an upper portion of the fuse pattern section, scattering or smoke emission in the fuse pattern section when an overcurrent occurs may be prevented.

Effects of the present disclosure is not limited to the above-described effects, and effects not mentioned will be clearly understood by those of ordinary skill in the art to which the present disclosure belongs from the present specification and accompanying drawings.

MODE FOR DISCLOSURE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

A film-type cable to be described hereinafter may be interpreted to collectively refer to a flexible flat cable (FFC) or a flexible printed circuit board (FPCB).

The film-type cable may be used to sense the voltages or temperatures of battery cells and transmit the sensed voltages or temperatures to a battery management system (BMS). Although not shown for convenience of drawings, a cable connector may be coupled to one end of the film-type cable, and welding plates for connecting electrode leads of battery cells to respective conducting wires may be coupled to the other end thereof.

Although described below in detail, when supplying power or transmitting a signal, a film-type cable according to the present disclosure is configured to block overcurrent by performing a fuse function by itself to prevent the overcurrent from flowing through to a load or the BMS.

Figure 1:
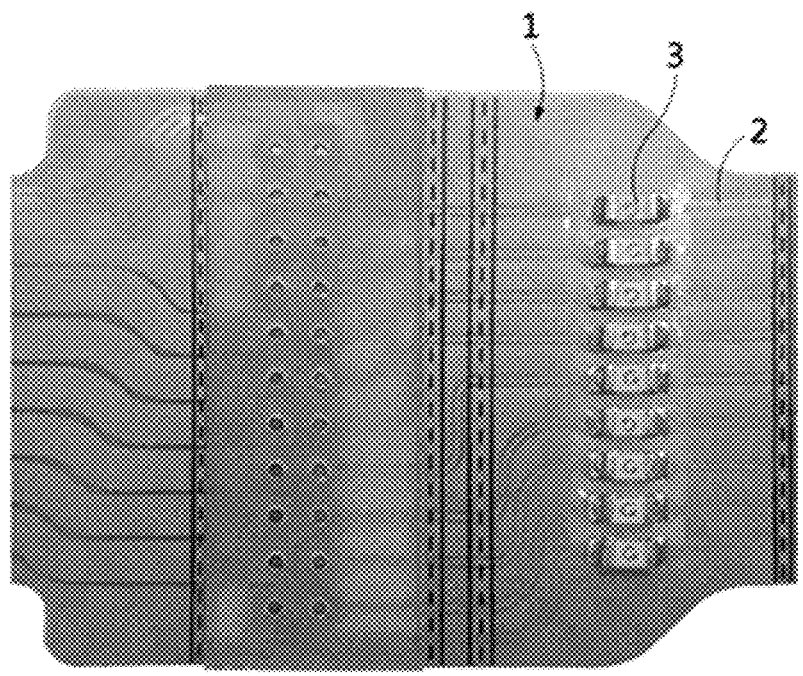
FIG. 1 is a diagram of a portion of a film-type cable on which a surface-mount device (SMD) fuse is mounted, according to the related art.
Figure 2:
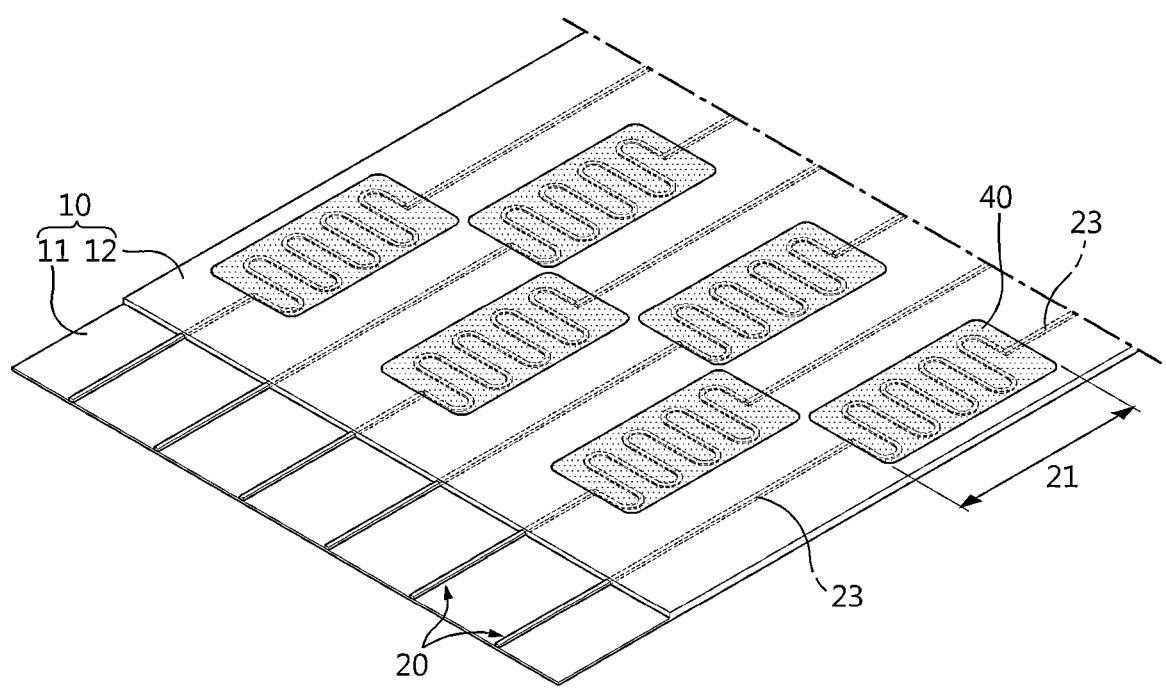
FIG. 2 is a schematic perspective view showing a configuration of a film-type cable according to an embodiment of the present disclosure.
Figure 2:
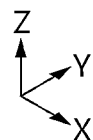
Figure 3:
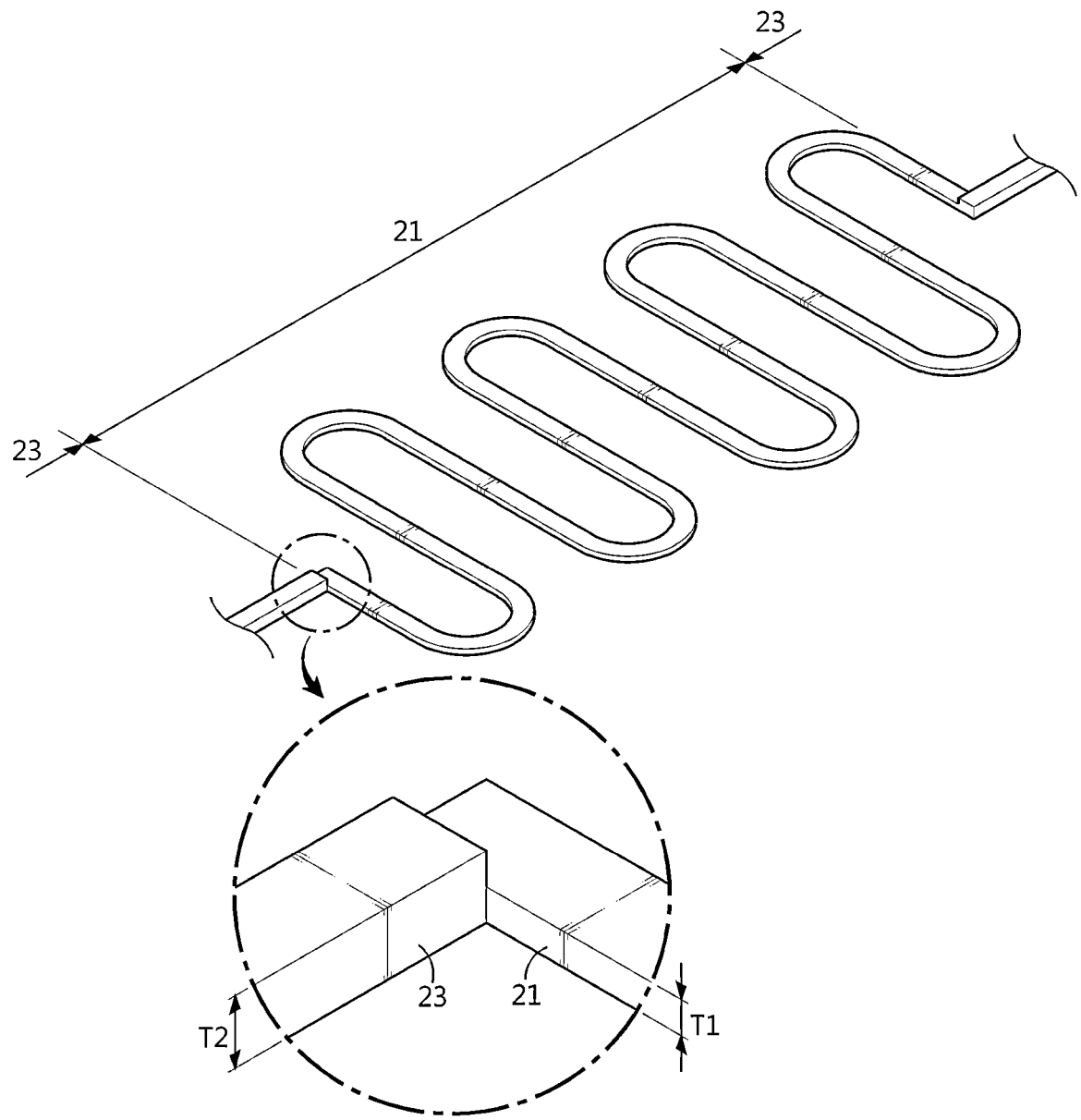
FIG. 3 is a schematic diagram showing a configuration of a strand of a conducting wire according to an embodiment of the present disclosure.

FIG. 2 is a schematic perspective view showing a configuration of a film-type cable according to an embodiment of the present disclosure, and FIG. 3 is a schematic diagram showing a configuration of a strand of a conducting wire according to an embodiment of the present disclosure.

Referring to the drawings, a film-type cable according to an embodiment of the present disclosure includes an insulating film 10 and a plurality of conducting wires 20 extending side by side at a predetermined interval and covered with the insulating film 10. Also, each of the plurality of conducting wires 20 includes a fuse pattern section 21 and a normal section 23.

The insulating film 10 includes a base film 11 and a cover film 12 as components for insulating and covering the conducting wires 20. The base film 11 is arranged under the plurality of conducting wires 20, and the cover film 12 may be arranged on the plurality of conducting wires 20.

The insulating film 10 may be manufactured of polyethylen terephthalate (PET), polycyclohexanedimethylene terephthalate (PCT), polyethylene naphthalate (PEN), polyimide (PI), or the like. Preferably, the insulating film 10 may be manufactured of PI. Among the above-described materials, a PI film has the highest heat resistance, and thus, there is almost no problem even when the PI film is used in a high-temperature environment.

Generally, an FFC is manufactured by attaching conducting wires, which are obtained by processing a thin copper foil plate to a certain width and thickness, onto a base film at a certain interval and attaching again a cover film thereonto. Also, a FPCB is manufactured by arranging a thin copper stack plate on a base film, laminating a dry film, forming conducting wires having a certain interval through exposure, development, and etching processes, and then attaching a cover film thereto. However, the width of a thin copper foil plate may be implemented relatively freely, but it may be difficult to achieve a thickness (height) of a small size of up to units of micrometers (μm), and it may be more difficult to implement a strand of a conducting wire to have various thicknesses. For these reasons, in a method of manufacturing a film-type cable of the related art, it is difficult to implement a fuse pattern on a conducting wire itself.

Accordingly, instead of the method of manufacturing the film-type cable of the related art, in the film-type cable according to an embodiment of the present disclosure, a printed electronic method is used for manufacturing the plurality of conducting wires 20.

For example, the plurality of conducting wires 20 may be implemented by printing silver (Ag) nano electronic ink on a surface of the base film 11 by using printed electronic equipment. The Ag nano electronic ink printed on the base film 11 may sufficiently function as a conducting wire 20 having excellent electrical conductivity after a short drying time. Also, according to the printed electronic method, the width of a strand of one conducting wire 20 may be freely implemented, and various thicknesses thereof may be simply implemented.

That is, in the plurality of conducting wires 20 of the film-type cable according to an embodiment of the present disclosure, the fuse pattern section 21 and the normal section 23 may be formed of Ag nano electronic ink.

The fuse pattern section 21 refers to a section configured to be fused when a current exceeding a rated current flows, and the normal section 23 refers to a section that is not fused or disconnected when a current exceeding the rated current flows.

In detail, referring to FIG. 3, a thickness T1 of the conducting wire 20 in the fuse pattern section 21 is less than a thickness T2 of a conducting wire in the normal section 23, and the conducting wire 20 is provided to be elongated in the fuse pattern section 21.

For example, when it is assumed that an overcurrent flows in a conducting wire including a portion having a large resistance and a portion having a smaller resistance than that, more heat is generated in the portion having a large resistance. According to ($P=I^2 \times R$), when an overcurrent flows in the conducting wire, fusion and disconnection are more likely to occur in the portion having a large resistance.

$$R \approx L/A [\Omega] \ (R: \text{resistance}, L: \text{length of conducting wire}, A: \text{cross-sectional area of conducting wire})$$

As it may be seen from the above formula, the resistance of a conducting wire is proportional to the length of the conducting wire and inversely proportional to the cross-sectional area (through which electric charges pass) thereof, and thus, when a specific portion of the conducting wire is made to be thin and long, the amount of heat generated increases when an overcurrent flows in the corresponding portion, thereby allowing the corresponding portion to act like a fuse.

The fuse pattern section 21 of the present embodiment may be said to be designed based on the above principle. That is, the width of the conducting wire 20 is maintained the same by adjusting a printing amount of Ag nano ink in the fuse pattern section 21 and the normal section 23, but the thickness of the conducting wire 20 is smaller in the fuse pattern section 21 than in the normal section 23 to reduce the cross-sectional area of the conducting wire 20. For reference, the thickness of the conducting wire 20 in the fuse pattern section 21 may be variously implemented according to the magnitude of rated current that the fuse pattern section 21 may withstand.

In the present embodiment, although the width of the conducting wire 20 is intactly maintained throughout the fuse pattern section 21 and the normal section 23 and only the thickness thereof is reduced in the fuse pattern section 21, the width and thickness of the conducting wire 20 may be simultaneously reduced in the fuse pattern section 21. However, in the present embodiment, it is considered that when the width and thickness of the conducting wire 20 are simultaneously reduced, the rigidity of the conducting wire 20 may be significantly reduced. This is to prevent the conducting wire 20 of the fuse pattern section 21 from being easily broken by a physical shock or vibration rather than an overcurrent.

Also, the conducting wire 20 of the present embodiment may have a repeating "ㄹ" shape or "S" shape pattern so as to have the length as long as possible within the fuse pattern section 21.

With this configuration, resistance is increased and heat is intensively generated in a region of the fuse pattern section 21 when an overcurrent occurs, so that the fuse pattern section 21 may be more effectively cut.

Referring back to FIG. 2, the fuse pattern sections 21 of neighboring conducting wires 20 may be alternatingly arranged.

Different magnitudes of current may flow in conducting wires 20 of the film-type cable, and for example, when fuse pattern sections 21 of respective conducting wires 20 are adjacent to each other (in an X-axis direction), an overcurrent flows in one of the conducting wires 20 such that sparks and heat generated in a fuse pattern section 21 of the corresponding conducting wire 20 may be easily transferred to a fuse pattern section 21 of a neighboring conducting wire 20. Accordingly, other surrounding fuse pattern sections 21 may be abnormally fused and disconnected or may emit smoke and ignite.

However, as in the present embodiment, in a case where fuse pattern sections 21 are alternatingly arranged, even when sparks or heat are generated in a fuse pattern section 21 of one conducting wire 20, the effect may be small on a fuse pattern section 21 of other conducting wire 20.

Also, the fuse pattern section 21 of the present embodiment occupies a large area in a width direction (±X direction) of the film-type cable as the conducting wire 20 is formed in a repeating "ㄹ" shape or "S" shape pattern to extend the length of the conducting wire 20.

In order to arrange the fuse pattern sections 21 of the conducting wires 20 adjacent to each other (X-axis direction), an interval between conducting wires 20 needs to be increased compared to that of the present embodiment to ensure insulation between the conducting wires 20. Accordingly, an increase in the width of the film-type cable and an increase in a surplus space may be undesirable.

However, in the present embodiment, because the fuse pattern sections 21 of conducting wires 20 are alternatingly arranged, ensuring insulation of the conducting wires 20 and setting a minimum pitch thereof may be facilitated.

Meanwhile, the film-type cable according to an embodiment of the present disclosure may further include a smoke-proof coating solution 40 coated on the fuse pattern section 21 of the plurality of conducting wires 20.

The smoke-proof coating solution 40 is a component applied to the fuse pattern section 21 to prevent sparks and smoke or scattering of debris during an operation, that is, when the conducting wire 20 is fused and disconnected due to overcurrent. At least one of a urethane resin, an epoxy resin, an epoxy resin, and an acrylic resin may be employed as a material for the smoke-proof coating solution 40. Preferably, polyurethane, which is known as the most effective insulation material while containing relatively few environmentally harmful substances, may be suitable as a material for the smoke-proof coating solution 40.

Figure 4:
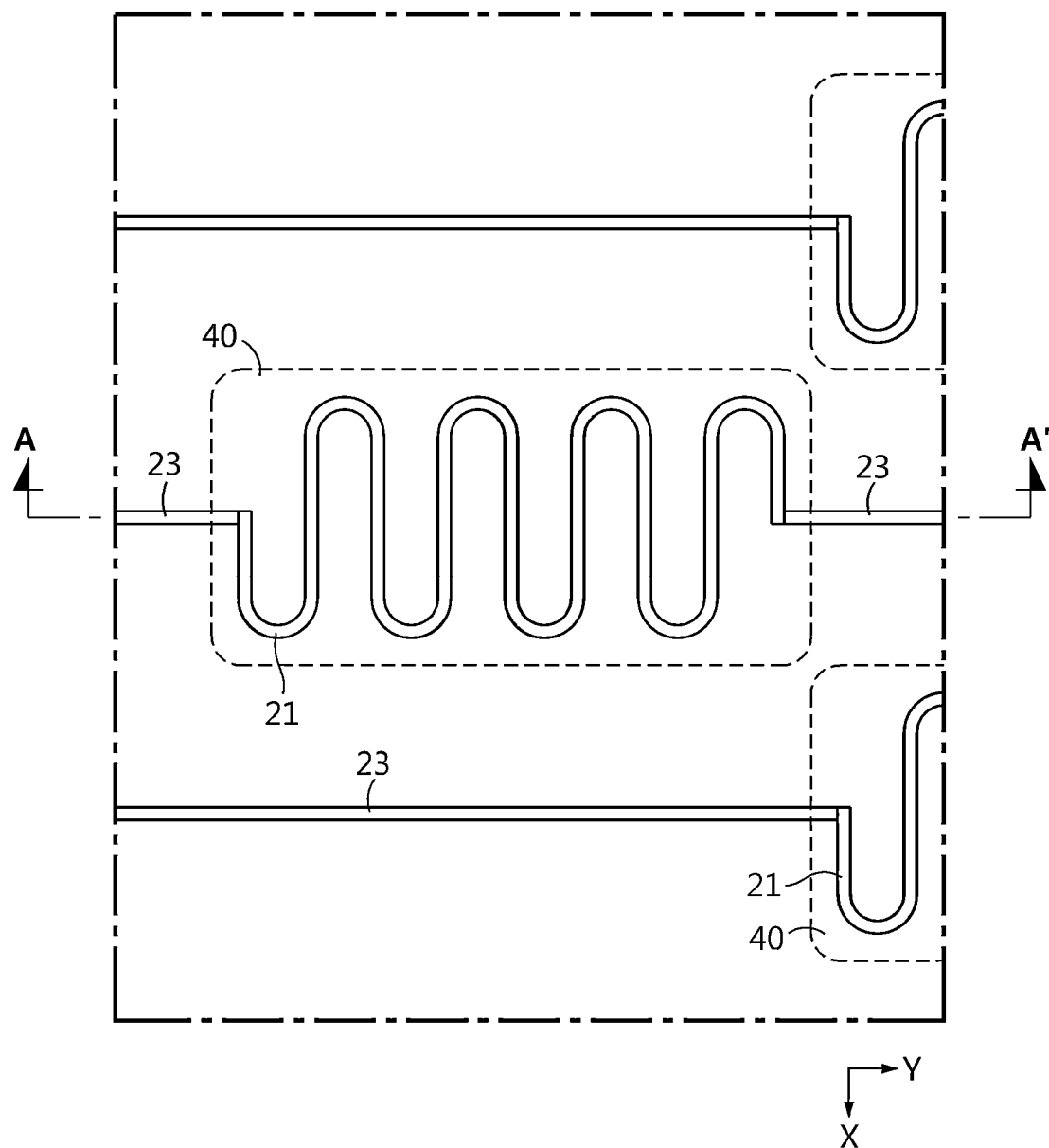
FIG. 4 is a plan view of one region of a film-type cable according to the present disclosure.
Figure 5:
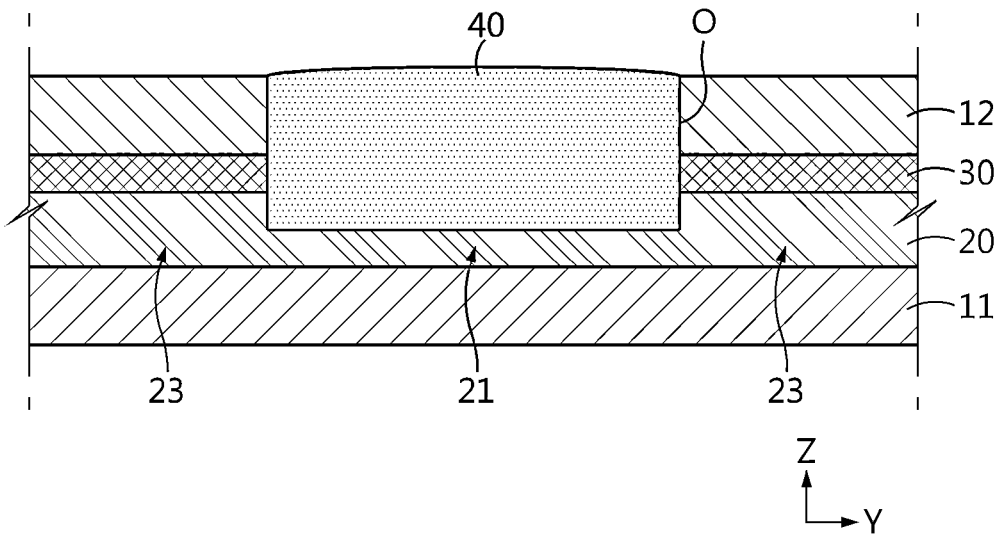
FIG. 5 is a schematic cross-sectional view of a film-type cable taken along line A-A' of FIG. 4.

In detail, referring to FIGS. 4 and 5, because the conducting wires 20 are formed by printing Ag nano ink on the base film 11 by the printed electronic method, an adhesive is not required between the conducting wires 20 and the base film 11, and because an adhesive is used only when the cover film 12 is laminated on the conducting wires 20, an adhesive layer 30 may be provided on the conducting wires 20 in the normal section 23 and on the cover film 12.

In the present embodiment, the cover film 12 is used to cover only an upper portion of the normal section 23 of the conducting wires 20, and an upper portion of the fuse pattern section 21 of the conducting wires 20 is covered by the smoke-proof coating solution 40. The cover film 12 may be attached onto the conducting wires 20 while a region corresponding to the fuse pattern section 21 is pre-cut, or may be cut off by a region corresponding to the fuse pattern section 21 while being attached onto the conducting wires 20.

Thus, when the cover film 12 is attached onto the conducting wires 20 printed on the base film 11, an upper portion of the fuse pattern section 21 is in an open state, and a concave groove portion O surrounded by the cover film 12, the adhesive layer 30, and the fuse pattern section 21 may be formed. The smoke-proof coating solution 40 may be filled in the concave groove portion O, and when a predetermined period of time elapses, the smoke-proof coating solution 40 may be cured to form a coating layer.

Next, in the film-type cable, a design experiment example of the fuse pattern section 21 will be described.
1) Length of conducting wire 20 of fuse pattern section 21: 30-50 mm
2) Cross-sectional area (SQ) of conducting wire 20 of fuse pattern section 21: 0.001-0.003 mm$^2$
3) Thicknesses of base film 11 and cover film 12: 25-50 μm
4) Filling thickness of urethane-based smoke-proof coating solution 40: 0.05-0.45 mm While main data of the fuse pattern section 21 was adjusted within a range of 1) to 4), a short-circuit break test (50 A @ 63 V), a continuous current test (750 A @ 4 hours), and the like were performed, and as a result, the following results were obtained.

In a case where the conducting wire 20 of the fuse pattern section 21 had the length of 50 mm and the cross-sectional area (SQ) of 0.028 mm$^2$, when an overcurrent was applied, the performance was the best and scattering did not occur.

In a PEN & PCT film, as the insulating film 10, scattering was easily generated after the insulating film 10 was melted during an overcurrent application test & a short-circuit break test, but when a PI film was 25 μm to 50 μm thick, debris did not all scatter, and thus, there was no significant difference. Thus, it may be said that employing the PI film of 25 μm is reasonable in terms of a cost.

Figure 6:
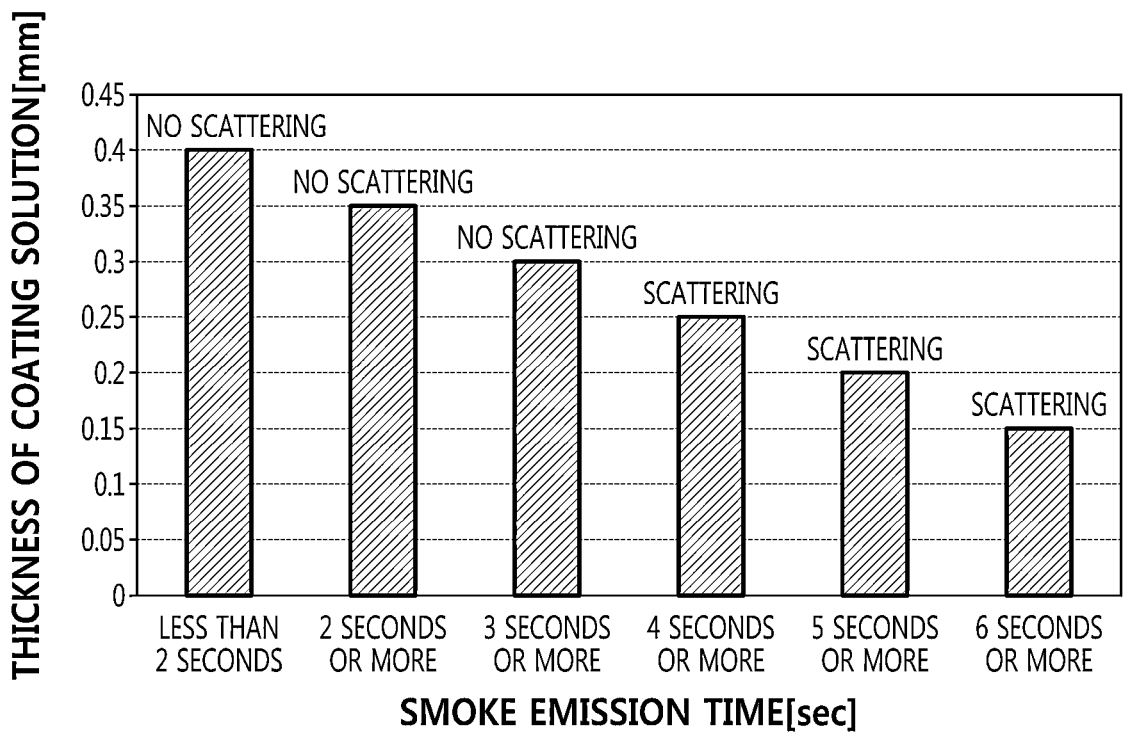
FIG. 6 is a graph showing a result value for each filling thickness of a smoke-proof coating solution during an overcurrent test of a film-type cable according to an embodiment of the present disclosure.

With respect to scattering and duration of smoke emission of a region of the fuse pattern section 21 according to a filling thickness of the smoke-proof coating solution 40, as shown in FIG. 6, there was no scattering when the thickness is 0.3 mm or more, and the duration of smoke emission shows similar aspect when the thickness is 0.35 mm and 0.4 mm.

Based on the experiment result, it is appropriate in terms of functionality and economy to design the length of the conducting wire 20 of the fuse pattern section 21 to be 50 mm and the cross-sectional area thereof to be 0.028 mm$^2$, and to use the base film 11 and the cover film 12, each including a PI material and having the thickness of 25 μm, and the urethane-based smoke-proof coating solution 40, wherein the thickness of a smoke-proof coating layer is 0.35 mm.

Figure 7:
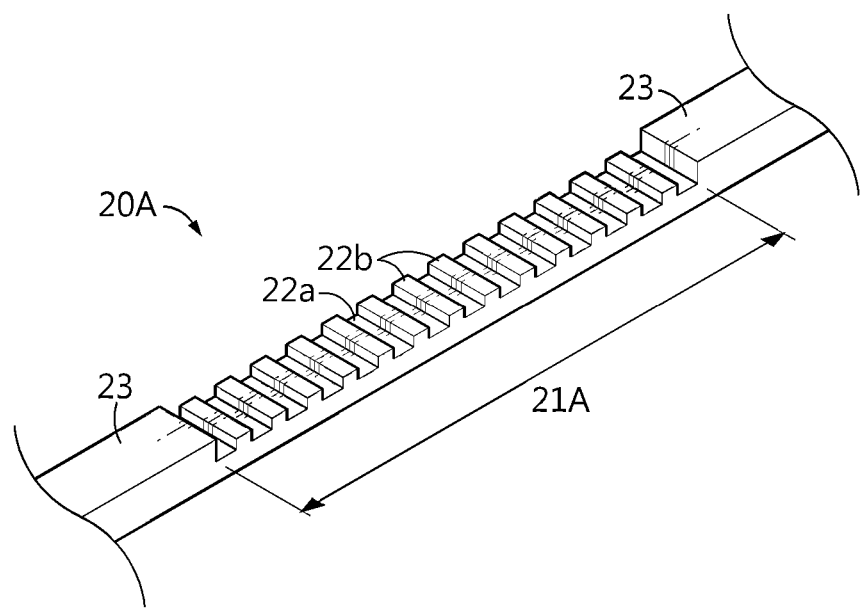
FIG. 7, as a diagram corresponding to FIG. 3, is a schematic diagram showing a configuration of a strand of a conducting wire of a film-type cable according to another embodiment of the present disclosure.
Figure 8:
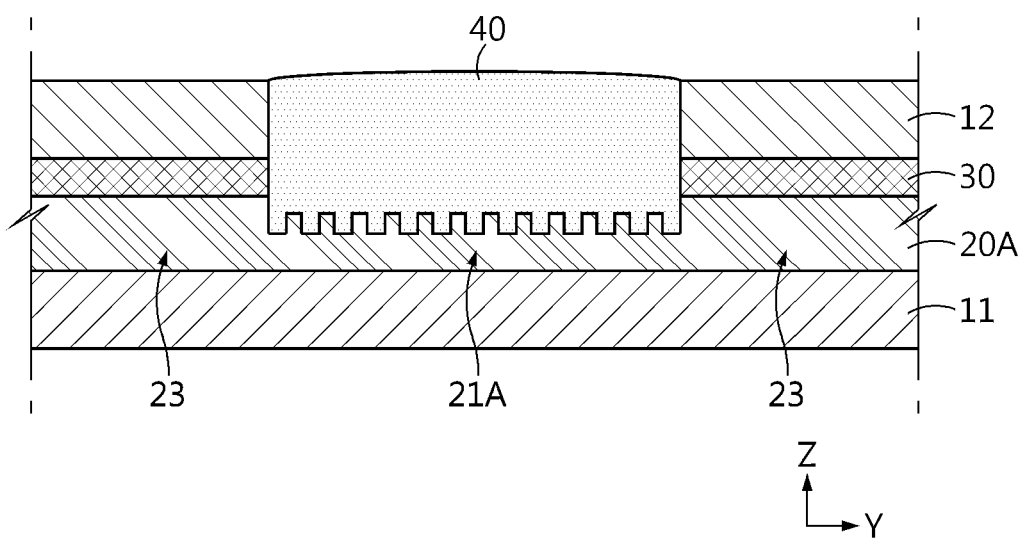
FIG. 8, as a diagram corresponding to FIG. 5, is a schematic cross-sectional view showing a film-type cable according to another embodiment of the present disclosure.

FIG. 7, as a diagram corresponding to FIG. 3, is a schematic diagram showing a configuration of a strand of a conducting wire 20 of a film-type cable according to another embodiment of the present disclosure, and FIG. 8, as a diagram corresponding to FIG. 5, is a schematic diagram showing a film-type cable according to another embodiment of the present disclosure.

Next, referring to FIGS. 7 and 8, a film-type cable according to another embodiment of the present disclosure will be described.

The same reference numerals as in the above-described embodiment denote the same members, and duplicate descriptions of the same members are omitted and differences from the above-described embodiments are mainly described.

When the present embodiment is compared with the above-described embodiment, there is a difference in a fuse pattern section 21A and remaining components are substantially the same. A conducting wire 20A in the fuse pattern section 21A of the present embodiment includes a thin-film portion 22a having a certain thickness and extending straight in one direction and protrusions 22b that are repeatedly formed to protrude upward at a predetermined interval in an extending direction of the thin-film portion 22a.

That is, the conducting wire 20A is provided to extend straight in one direction when having the same thickness in the normal section 23 and the fuse pattern section 21A. Thus, pitch setting between the conducting wires 20 may be further facilitated compared to the above-described embodiment. In the above-described embodiment, the conducting wire 20 of the fuse pattern section 21 has a pattern of a "ㄹ" shape or "S" shape that is repeated and extended, such that an area occupied by the fuse pattern section 21 is large, and thus, may be easily interfered with by a neighboring conducting wire 20, and in order to avoid interference, it is necessary to sufficiently increase the interval between the conducting wires 20. However, according to the present embodiment, a pitch between conducting wires 20A may be easily set, and thus, is free from the same problems as in the above-described embodiment.

Also, the fuse pattern section 21A of the present embodiment includes the thin-film portion 22a and the protrusions 22b, and thus, forms a structure in which the thickness of the conducting wire 20A repeatedly increases, decreases, increases, and decreases. Due to the repetition of thickness variation, a fatigue failure phenomenon may be induced whenever an overcurrent passes through a portion where the thickness decreases, and thus, the conducting wire 20A may be easily broken.

Also, the fuse pattern section 21A of the present embodiment has an uneven structure in a substantially vertical direction, such that the smoke-proof coating solution 40 and the conducting wire 20A of the fuse pattern section 21A may be in contact with each other over a wide area, and thus, the smoke-proof coating solution 40 may be more firmly coupled to the fuse pattern section 21A when cured.

As described above, according to the configuration and operation of the film-type cable according to the present disclosure, without mounting a surface-mount device (SMD) fuse on the conducting wire 20, a fuse function may be implemented. Thus, compared to a film-type cable of the related art, the burden caused by an increase in price due to a material cost of an SMD fuse, a processing cost incurred by mounting the SMD fuse, a defect cost, and the like may be eliminated.

Meanwhile, a battery module according to the present disclosure may include, for example, one or more film-type cables as a component for transmitting a voltage value or temperature value of battery cells to a BMS. Also, the battery module according to the present disclosure may further include, in addition to the film-type cable, a module housing for accommodating battery cells, and various devices for controlling charging/discharging of each of the battery cells, for example, a master BMS, a current sensor, and a fuse.

The battery module according to the present disclosure may be applied to an electric vehicle, a hybrid vehicle, an energy storage device, and the like.

As described above, although the present disclosure has been described according to limited embodiments and drawings, the present disclosure is not limited thereto, and various modifications and variations are possible within the scope of the technical idea of the present disclosure and claims to be described below by those of ordinary skill in the art to which the present disclosure pertains.

Meanwhile, when terms indicating directions such as up, down, left, right, front, and back are used in the present specification, these terms indicate relative positions and are only for convenience of explanation, it is apparent to those skilled in the art that these terms may vary depending on positions of an object, positions of an observer, or the like.

What is claimed is:

1. A film-type cable comprising:
    an insulating film; and
    a plurality of conducting wires covered by the insulating film and extending in a first direction, each of the plurality of conducting wires separated by a predetermined distance,
    wherein each of the plurality of conducting wires comprises:
    a fuse pattern section configured to be broken when a current exceeding a rated current flows through the fuse pattern section; and a normal section configured not to be broken when a current exceeding the rated current flows through the normal section,
    wherein each of the plurality of conducting wires has the same width in the fuse pattern section as in the normal section and a smaller thickness in the fuse pattern section than in the normal section, and the fuse pattern section has a repeating pattern of a "ㄹ" shape or "S" shape.

2. The film-type cable of claim 1, wherein the insulating film comprises:
    a base film arranged on a first side of the plurality of conducting wires; and
    a cover film arranged on a second side of the plurality of conducting wires opposite the first side in the normal section, wherein
    the plurality of conducting wires are formed of silver nano ink printed on a surface of the base film.

3. The film-type cable of claim 2, further comprising a smoke-proof coating solution coated in an upper portion of the fuse pattern section of the plurality of conducting wires.

4. The film-type cable of claim 3, wherein an adhesive layer is provided between the plurality of conducting wires in the normal section and the cover film, and
    the smoke-proof coating solution is filled in a concave groove portion formed by the cover film, the adhesive layer, and the fuse pattern section.

5. The film-type cable of claim 3, wherein the smoke-proof coating solution comprises one of a urethane resin, an epoxy resin, and an acrylic resin.

6. The film-type cable of claim 1, wherein the fuse pattern sections and the normal sections of adjacent conducting wires are alternatingly arranged.

7. The film-type cable of claim 1, wherein the insulating film comprises a polyimide material.

8. A battery module comprising the film-type cable according to claim 1.

* * * * *